(12) United States Patent
Kirkpatrick et al.

(10) Patent No.: US 11,910,519 B2
(45) Date of Patent: Feb. 20, 2024

(54) INTEGRATED CIRCUIT / PRINTED CIRCUIT BOARD ASSEMBLY AND METHOD OF MANUFACTURE

(71) Applicant: Eridan Communications, Inc., Mountain View, CA (US)

(72) Inventors: Douglas A. Kirkpatrick, San Francisco, CA (US); Quentin Diduck, Santa Clara, CA (US)

(73) Assignee: Eridan Communications, Inc., Sunnyvale, CA (US)

(*) Notice: Subject to any disclaimer, the term of this patent is extended or adjusted under 35 U.S.C. 154(b) by 470 days.

(21) Appl. No.: 17/369,676

(22) Filed: Jul. 7, 2021

(65) Prior Publication Data

US 2021/0337654 A1    Oct. 28, 2021

Related U.S. Application Data

(62) Division of application No. 16/695,377, filed on Nov. 26, 2019, now Pat. No. 11,089,671.

(51) Int. Cl.
| | | |
|---|---|---|
| H05K 7/20 | (2006.01) | |
| H05K 1/02 | (2006.01) | |
| H01L 23/367 | (2006.01) | |
| H05K 3/30 | (2006.01) | |
| H05K 3/00 | (2006.01) | |

(52) U.S. Cl.
CPC ......... *H05K 1/0204* (2013.01); *H01L 23/367* (2013.01); *H05K 3/0061* (2013.01); *H05K 3/305* (2013.01); *H05K 7/205* (2013.01); *H05K 7/20509* (2013.01); *H05K 2201/066* (2013.01)

(58) Field of Classification Search
CPC ...... H05K 3/0061; H05K 3/305; H05K 7/205; H05K 1/0204; H05K 2201/066; H05K 2201/09072; H05K 2201/09772; H05K 2201/10416; H01L 24/97; Y10T 29/49128; Y10T 29/4913
See application file for complete search history.

(56) References Cited

U.S. PATENT DOCUMENTS

| | | | | |
|---|---|---|---|---|
| 5,747,876 A | * | 5/1998 | Majumdar | ........... H05K 1/0204 361/716 |
| 6,411,516 B1 | * | 6/2002 | Palumbo | .............. H05K 1/0204 29/890.032 |
| 6,657,866 B2 | * | 12/2003 | Morelock | ............ H05K 1/0204 174/252 |
| 6,874,910 B2 | * | 4/2005 | Sugimoto | ............... H01L 24/97 362/267 |
| 9,717,163 B2 | * | 7/2017 | Shih | .................... H05K 7/20509 |

\* cited by examiner

*Primary Examiner* — Donghai D Nguyen
(74) *Attorney, Agent, or Firm* — William E. Winters; Patent Law Professionals, P.C.

(57) ABSTRACT

An integrated circuit/printed circuit board (IC-PCB) assembly comprises a PCB and a heatsink plate. The PCB has a first side including a first patterned conductive layer with one or more thermal pads onto which one or more heat slugs of one or more ICs mount, and a second, opposing side including a second patterned conductive layer with a heatsink plate receiving pad onto which the heatsink plate mounts. The heatsink plate has one or more posts that project from a mounting surface of the heatsink plate, and when the heatsink plate is mounted to the heatsink plate receiving pad, each post extends from the second side of the PCB, through a matching hole in the PCB, and to an associated thermal pad located on the first side of the PCB.

10 Claims, 5 Drawing Sheets

INTEGRATED CIRCUIT / PRINTED CIRCUIT BOARD ASSEMBLY AND METHOD OF MANUFACTURE

CROSS-REFERENCE TO RELATED APPLICATIONS

This is a divisional application of U.S. patent application Ser. No. 16/695,377, filed Nov. 26, 2019, the disclosure of which is incorporated herein be reference.

BACKGROUND OF THE INVENTION

Printed circuit boards (PCBs) are used to provide mechanical support and electrical connectivity between electrical components of an electrical circuit or system. Integrated circuits (ICs) are one of the many types of electrical components that are commonly mounted on a PCB, the others including devices such as resistors, capacitors, inductors, diodes, and transistors. In general, there are two approaches to mounting ICs onto a PCB. One approach known as "through-hole mounting" (THM) involves inserting leads of a packaged IC through holes in the PCB and then soldering the leads to conductive pads on the opposite side of the PCB. In the other approach, known as "surface mount technology" (SMT), the leads of the IC package are soldered to pads located on the same side of the PCB that the IC is mounted, or the IC is mounted to the PCB in unpackaged form as a bare "chip" or "die," for example, by gluing the IC to the PCB and then welding fine wires between electrical connections on the bare IC to conductive pads on the PCB (known as "chip on board" or "COB") or by inverting the bare chip and securing it to the PCB using balls of solder placed at locations on the PCB where electrical connections to the chip are required (known as "flip chip on board").

SMT has a number of advantages over THM. Some of these advantages follow from not having to drill the many holes required for the ICs' and other components' leads, which not only makes assembly faster and less expensive, but also allows the PCB to be manufactured with a higher density of electrical traces. SMT components are also usually less expensive to manufacture than THM components and SMT ICs can be manufactured to have closer lead-to-lead spacings, resulting in overall smaller component sizes and the PCB being able to accommodate a higher density of components.

Figure 1:
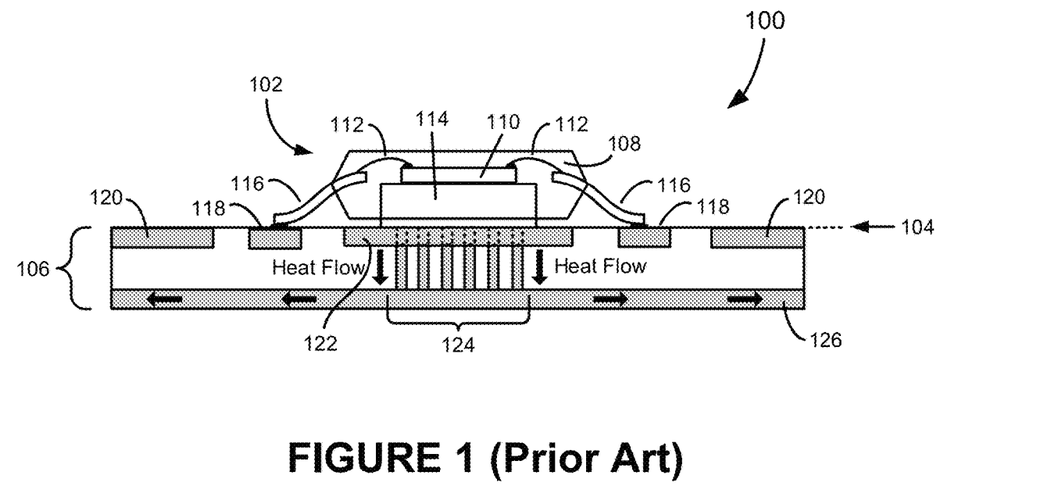
FIG. 1 is a cross-sectional drawing of a portion of a prior art integrated circuit/printed circuit board (IC-PCB) assembly.

Various IC packaging types have been developed over the years to support SMT. One of the most widely used is the so-called "quad flat pack" or "QFP." A QFP is a square- or rectangular-shaped package with leads that project from the package periphery and bend down in a "gull-wing" shape so that they land on matching pads on the PCB surface. FIG. 1 is a cross-sectional drawing of a portion of a typical QFP IC-PCB assembly 100, highlighting how the QFP 102 is surface-mounted to a top surface 104 of the PCB 106. The QFP 102 comprises a plastic enclosure 108 that encapsulates an IC 110, bond wires 112, a heat slug 114, and portions of leads 116. The leads 116 project through the plastic enclosure 108, along the periphery of the QFP 102, i.e., along the plastic enclosure's 108's four sides, and are soldered to conductive pads 118 patterned in a top conductive layer 120 of the PCB 106. The bottom surface of the heat slug 114 is soldered, or glued using thermally conductive adhesive, to a landing pad 122 also formed in the top conductive layer 120.

Not all applications require the QFP 102 to include a heat slug 114 to conduct heat away from the IC 110. However, in circumstances where one is needed, a plurality of thermal vias 124 (i.e., a "thermal via array 124") is commonly formed through the PCB 106. (See FIG. 2, which is a plan view of the landing pad 122, better illustrating the thermal via array 124.) The thermal vias 124 serve as paths that conduct heat generated by the IC 110 and collected by the heat slug 114 down to a second conductive PCB layer 126. The second conductive PCB layer 126 serves as a heatsink and also, typically, as a ground plane.

Figure 2:
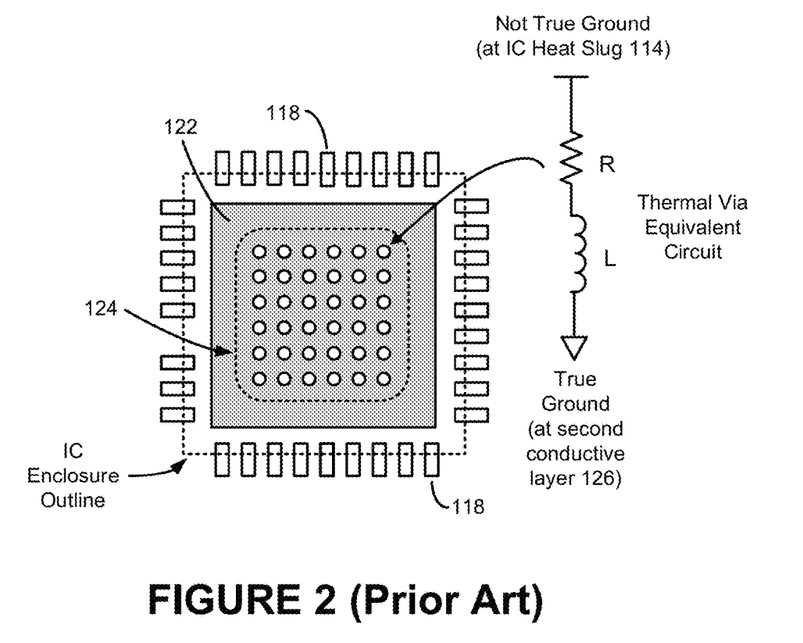
FIG. 2 is a plan view of the IC landing pad of the prior art IC-PCB assembly depicted in FIG. 1, further revealing the thermal via array formed through the IC landing pad and PCB and highlighting the undesirable thermal via resistance and inductance of each thermal via.

Although the thermal vias 124 are thermal conductors, each also has an electrical resistance R and electrical inductance L, which are undesirable since they can, under some circumstances, adversely affect the performance of the IC 110 and/or the ability of the IC-PCB assembly 100 to adequately conduct heat away from the IC 110. The resistances of the thermal vias can be problematic since they contribute to FR losses, and their inductances can be problematic since they result in a voltage drop that increases with frequency. The combined voltage drop of the thermal via resistors and inductors can also cause the electric potential of the heat slug 114 to undesirably deviate from true ground potential and to vary with frequency. These problems may not be of significant concern if the IC 110 does not operate at high powers and high frequencies, but they can be significant, and even unacceptable, if the IC 110 does in fact operate at high powers and/or high frequencies, such as is often the case in radio frequency (RF) applications. For example, if the IC 110 is an RFIC comprising an RF power amplifier (RFPA) designed to operate over a wide range of high frequencies, the inability to effectively conduct heat away from the RFPA can result in the RFPA's power transistor(s) operating too hot and consequently being unable to generate sufficient RF power. The RF output power generated by the RFPA will also undesirably roll off at higher frequencies due to the frequency-dependent voltage drop caused by the inductance of the thermal via array 124. Some of these problems can be mitigated by employing a recessed ceramic flat pack assembly, for example. However, ceramic flat packs and recessed mounting are expensive and typically reserved for military applications, where cost is not a major concern, in other words, are not an optimal solution for commercial applications.

It would be desirable, therefore, to have a surface-mount IC-PCB assembly and associated mounting method that are more effective at conducting heat away from and IC than described above, even for high-power RFICs, and at the same time are able to exploit the low cost of plastic surface-mount-type packaging, for example, plastic-packaged QFPs.

BRIEF SUMMARY OF THE INVENTION

An integrated circuit/printed circuit board (IC-PCB) assembly and a method of its manufacture are disclosed. An exemplary IC-PCB assembly comprises a PCB and a heatsink plate. The PCB has a first side including a first patterned conductive layer with one or more thermal pads onto which one or more heat slugs of one or more ICs mount, and a second, opposing side including a second patterned conductive layer with a heatsink plate receiving pad onto which the heatsink plate mounts. The heatsink plate has one or more posts that project from a mounting surface of the heatsink plate, and when the heatsink plate is mounted to the heatsink plate receiving pad, each post extends from the second side of the PCB, through a matching hole in the PCB, and to an associated thermal pad located on the first side of the PCB.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 3:
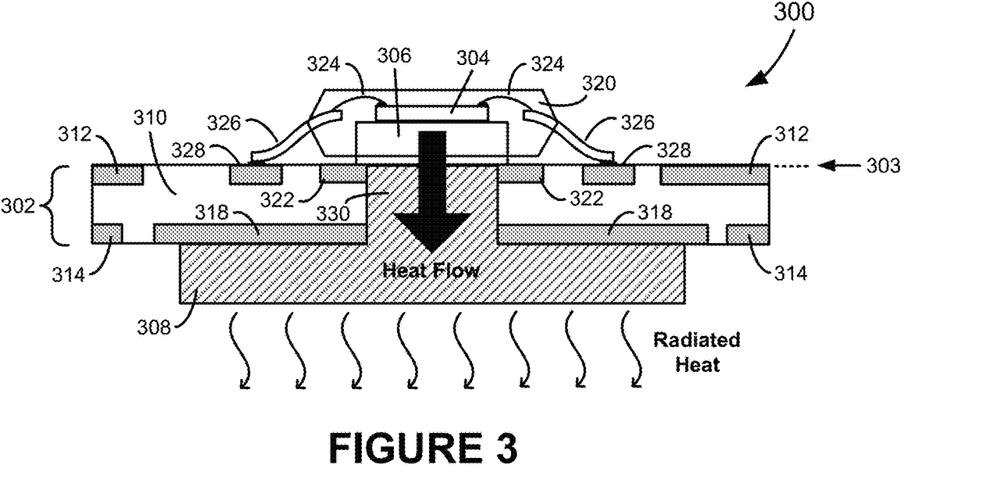
FIG. 3 is a cross-sectional drawing of a portion of an IC-PCB assembly, according to one embodiment of the present invention.

Referring to FIG. 3, there is shown a cross-sectional drawing of a portion of an integrated circuit/printed circuit board (IC-PCB) assembly 300, according to an embodiment of the present invention. In general, the IC-PCB assembly 300 comprises three principal components: a PCB 302, an IC 304 with heat slug 306, and a heatsink plate 308. The PCB 302 includes a non-conductive substrate 310, a first conductive (preferably copper) layer 312, and second conductive layer (also preferably copper) 314. The first conductive layer 312 is laminated to a top surface of the non-conductive substrate 310 and is etched according to a predetermined pattern to leave signal traces for electrically connecting components mounted on the PCB 302 and pads onto which leads of the various components are soldered.

The second conductive layer 314 is laminated to a bottom surface of the non-conductive substrate 310 and also etched to leave a heatsink plate receiving pad 318 onto which the heatsink plate 308 mounts. (Note that in this exemplary embodiment of the IC-PCB assembly 300, the PCB 302 has just a single non-conductive substrate 310 and two conductive layers 312 and 314. However, it could alternatively comprise a multi-layered laminate with more than two conductive layers, as will be appreciated by those of ordinary skill in the art.)

Figure 4:
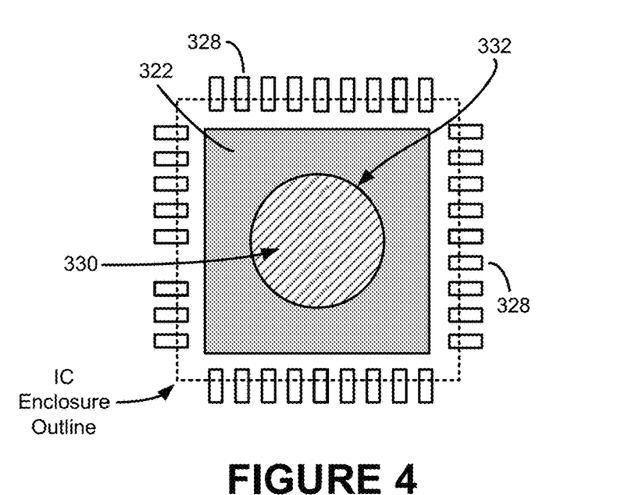
FIG. 4 plan view of the IC landing pad of the IC-PCB assembly depicted in FIG. 3, further revealing the single-hole IC landing pad design and the top surface of the heatsink plate post.

The IC 304 in the exemplary IC-PCB assembly 300 preferably comprises a quad flat pack (QFP), or other similar surface-mount IC package, with the IC 304 enclosed in an enclosure or encapsulant 320 (plastic, preferably, to save costs) and the heat slug 306 accessible through an opening in the enclosure bottom. The exposed bottom surface of the heat slug 306 is soldered to an IC landing pad 322 (i.e., thermal pad 322) patterned in the first conductive layer 312 or attached to the thermal pad 322 using a thermally conductive adhesive. Wire bonds 324, also enclosed within the IC enclosure 320, provide the electrical connections between the IC 304 and leads 326, which project through the enclosure 320, along the enclosure's four sides, and which are soldered to lead pads 328 also patterned in the first conductive layer 312 of the PCB 302. The thermal pad 322 for the heat slug 306 and the lead pads 328 onto which the IC's 304's leads 326 are soldered can be more readily observed in the plan view drawing presented in FIG. 4. It should be mentioned that although a QFP is preferred, the IC 304 can be mounted to the PCB 302 using essentially any surface-mount technology, so long as the IC 304 is also equipped with a heat slug. For example, a plastic-leaded chip carrier (PLCC) or leadless chip carrier (LCC) could be used. The IC 304 could also be surface mounted without a chip carrier and in unpackaged form, for example, as a chip-on-board (COB) over an underlying and accompanying heat slug.

The heatsink plate 308 has a top surface (i.e., mounting surface) that is soldered to the heatsink plate receiving pad 318 or attached to the heatsink plate receiving pad 318 using a thermally conductive adhesive. As the heatsink plate 308 is being positioned for mounting, a post 330 projecting from the top surface of the heatsink plate 308 is inserted into a single large via hole 332 formed through the PCB 302 and centered at the middle of thermal pad 322, as can be best seen in FIG. 4. Preferably, and as can be best seen in FIG. 3, the post 330 has a length that results in the post's top surface being coplanar with the top surface of the thermal pad 322. In this way, once the heatsink plate 308 is mounted onto the heatsink plate receiving pad 318, both the thermal pad 322 and the top surface of post 330 are in direct physical and thermal contact with the IC's 304's heat slug 306. Note that whereas the heat slug 306 serves as a thermally conductive conduit between the post 330 of the heatsink plate 308 and IC 304, it will also typically serve, though not necessarily, as a means for grounding the IC 304 to the PCB 302, in which case the heatsink plate 308 and its post 330 not only bring the heatsink to the top surface 303 of the PCB 302 but also bring all return currents to the top surface 303.

In one embodiment of the invention, the wall defining the via hole 332 is plated (for example, with copper) after being formed during the manufacturing process, thereby providing an electrical connection between the thermal pad 322 in the first conductive layer 312 on the top (front side) of the PCB 302 to the heatsink plate receiving pad 318 in the second conductive layer 314 on the bottom (back side) of the PDCB 302, and the diameter of the post 330 is made to be just slightly smaller than the diameter of the via hole 332, so that when the post 330 is inserted into the plated via hole 332, it fits snugly and makes good thermal contact with the plated via hole 332. Compared to the via hole array 124 used in the prior art IC-PCB assembly 100 (see FIGS. 1 and 2 and accompanying description), the large plated single via hole 332 provides a superior electrical connection, even in the absence of the post 330, including a lower inductance, regardless of the size of the post 330. In another embodiment of the invention, the diameter of the post 330 is made even smaller, in other words, so that the post 330 does not fit snugly within the plated via hole 332 but rather so that a small gap is present around the post 330 when inserted into the plated via hole 332. The small gap is then filled with molten solder or a thermally conductive (or thermally and electrically conductive) adhesive, during the time the heatsink plate 308 is being mounted onto the heatsink plate receiving pad 318 and/or during the time the IC's 340's heat slug 306 is being soldered to the thermal pad 322. Any gap between the top surface of the post 330 and top surface of the thermal pad 322, whether intentionally or unintentionally formed, can also be filled (e.g., with solder), during the time the IC heat slug 306 is being mounted to the thermal pad 322. It should be mentioned that although the post 330 is preferably a cylinder with a circular cross section and the post's 330's corresponding via hole 332 is also preferably circular, other geometries are possible. For example, the post 330 could be a four-sided column with a square, rectangular, or trapezoidal cross section, or a polyhedron with a cross section having more than four sides. Additionally, although the cross section of the post 330 is preferably of the same shape as the via hole 332 (e.g., both circular), their shapes could be different. For example, the post 330 could be a four-sided column with a square cross section while the via hole 332 is circular.

Figures 5A, 5B:
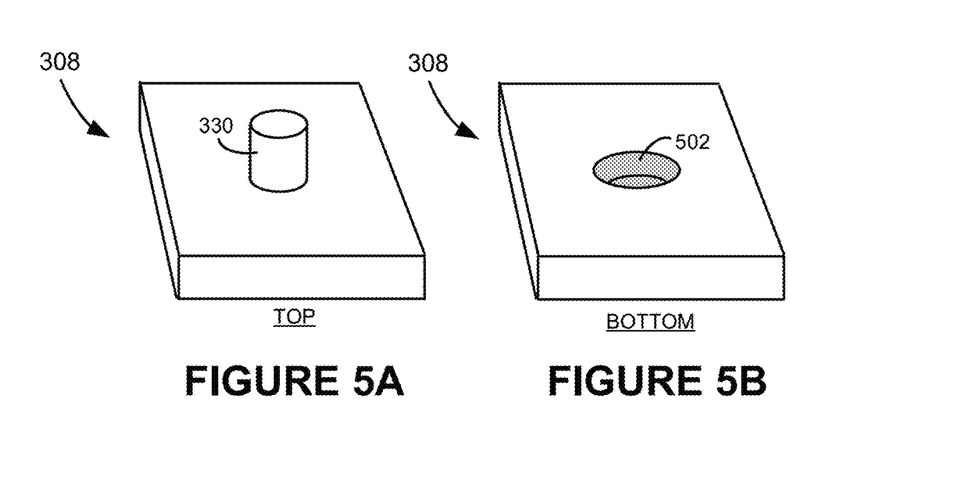
FIGS. 5A and 5B are top and bottom perspective views of the single-post heatsink plate of the IC-PCB assembly depicted in FIG. 3, in accordance with one embodiment of the present invention.

FIG. 5A is a top perspective view of the heatsink plate 308, better highlighting the shape of its post 330, which is preferably cylindrical with a circular cross section. The single-post design is superior to the thermal via array approach used in prior art IC-PCB assemblies since it allows heat generated by the IC 304 and collected by the heat slug 306 to be more efficiently and effectively conducted away from the IC. In most cases the thermal performance is so effective that low-cost plastic surface-mount packaging for the IC 304 can be used, thus avoiding the high cost of ceramic packaging. The single-post design also minimizes FR losses, and, unlike prior art thermal via arrays, provides a low inductance path, which is especially important in circumstances where the IC 304 is an RFIC. Assembly is also simpler and less costly since only a single large via hole 332 needs to be formed through the PCB 302 to receive the single post 330. In one embodiment of the invention, the heatsink plate 308 is copper and its post 330 is formed using a metal stamping process, similar to that used in the manufacture of automotive metal parts. (Note that when manufactured according to such a process, a divot 502 incidentally forms in the bottom of the heatsink plate 308, as illustrated in the bottom perspective view of the heatsink plate 308 presented in FIG. 5B.) It should be mentioned that although a metal stamping process is preferred due to its simplicity and low cost, the heatsink plate 308 and its post 330 can be alternatively manufactured using milling, casting, a combination of stamping, milling and casting, or, in fact, using any suitable metal working or metal shaping process.

Figure 6:
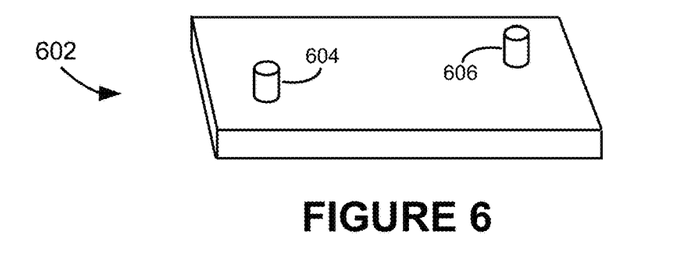
FIG. 6 is a perspective view a multi-post heatsink plate used in other IC-PCB assemblies of the present invention.
Figure 7:
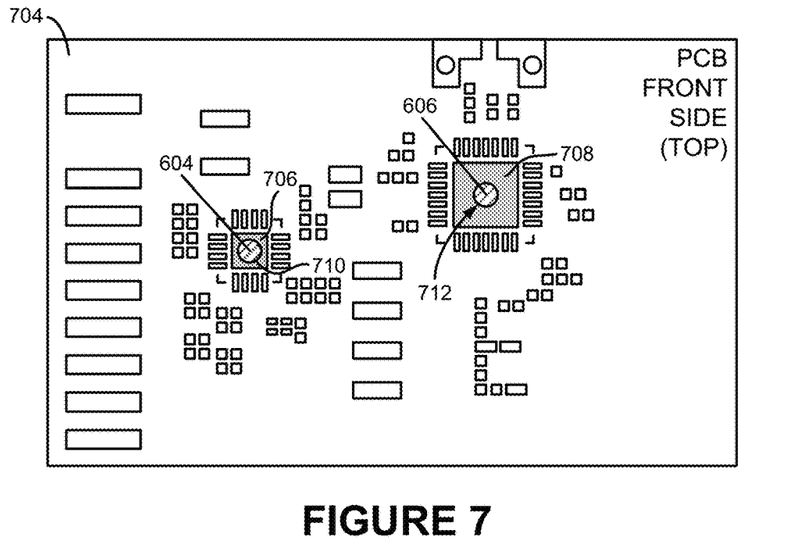
FIGS. 7 and 8 are front side (top) and back side (bottom) plan views of an exemplary PCB, illustrating how the two posts of the multi-post heatsink plate depicted in FIG. 6 are inserted into and reach through first and second holes formed through the PCB, and showing the heatsink plate receiving pad onto which the multi-post heatsink plate mounts.
Figure 8:
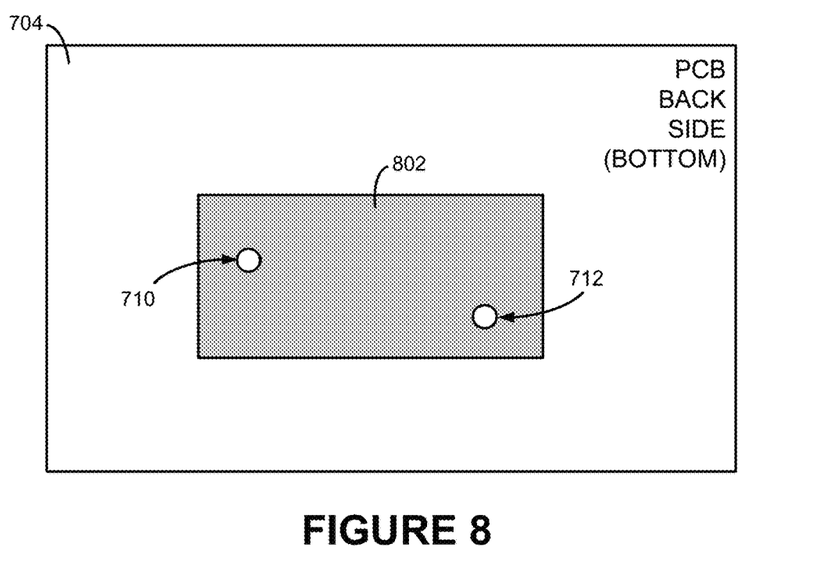

FIGS. 6-8 are drawings depicting a multi-post heatsink plate 602 (FIG. 6) and related IC-PCB assembly, according to another embodiment of the present invention. In this exemplary embodiment, the heatsink plate 602 is manufactured to have two posts 604 and 606 that serve to conduct heat away from two separate ICs (not shown) when mounted on the PCB 704. Similar to as in the single-post design described above, the multi-post heatsink plate 602 is soldered to a heatsink plate receiving pad 802 formed in a conductive layer on the back side of the PCB 704 (see FIG. 8) or glued to the heatsink plate receiving pad 802 using a thermally conductive adhesive. Only two large holes 710 and 712 need to be formed through the PCB 704 in order to receive the two posts 604 and 606. Preferably, though not necessarily, the lengths of the two posts 604 and 606 are trimmed as necessary so that when the multi-post heatsink plate 602 is mounted to the heatsink plate receiving pad 802 the top surfaces of the two posts 604 and 606 are coplanar with the top surfaces of corresponding IC landing pads (thermal pads) 706 and 708 formed in a top conductive layer on the top side of the PCB 704 (see FIG. 7). In this way, once the two ICs are mounted on the top side of the PCB 704, the thermal pad 706 and top surface of corresponding post 604 and the thermal pad 708 and top surface of corresponding post 606 are both in direct physical and thermal contact with the heat slugs of their respective ICs. Any gap between the top surface of the post 604 and top surface of thermal pad 706 and any gap between the top surface of the post 606 and thermal pad 708, whether intentionally or unintentionally formed, can also or alternatively be filled (e.g., with solder) during the time the ICs' heat slugs are being mounted to the thermal pads 706 and 708. To further enhance thermal and electrical connectivity, the interior surfaces of the PCB defining the two large holes 710 and 712 can be plated (e.g., with copper) prior to mounting the heatsink plate 602 to the backside of the PCB 704. Finally, similar to as in the single-post design described above, the diameters of the posts 604 and 606 can be made so that they either fit snugly in the plated via holes, or so that they do not fit snugly but rather so that small gaps are present around the posts 604 and 606 and between the plated via holes 710 and 712. In the latter approach, the small gaps are filled with molten solder or a thermally conductive (or thermally and electrically conductive) adhesive during the time the heatsink plate 602 is being mounted onto the heatsink plate receiving pad 802 and/or during the time the ICs' heat slugs are being soldered to the thermal pads 706 and 708.

Figure 9:
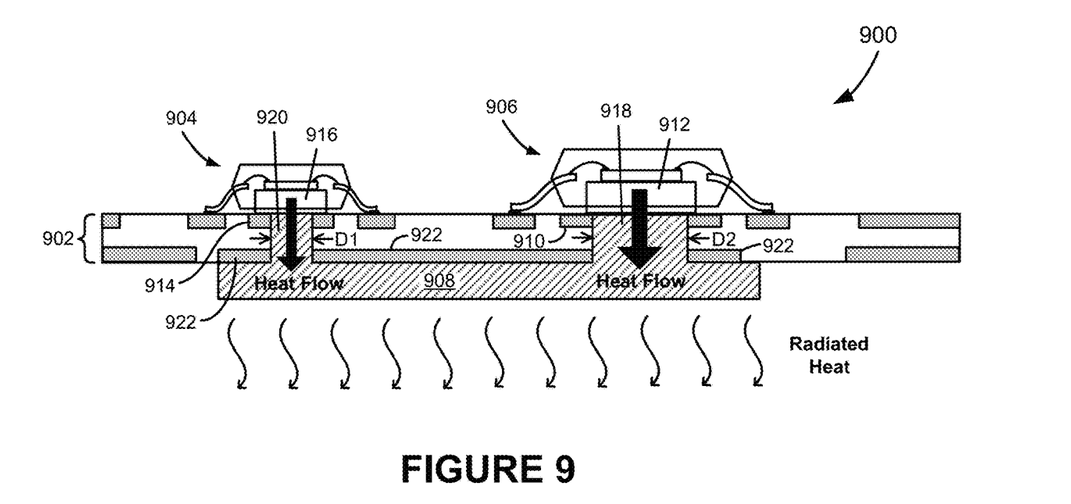
FIG. 9 is a cross-sectional drawing of a portion of IC-PCB assembly that includes a multi-post heatsink plate similar to that depicted in FIG. 6, according to an embodiment of the present invention.

FIG. 9 is a cross-sectional drawing of a portion of an IC-PCB assembly 900 that has been manufactured and assembled similar to that described above in reference to FIGS. 6-8. The IC-PCB assembly 900 comprises a PCB 902, first and second radio frequency ICs (RFICs) 904 and 906, and a heatsink plate 908. In this exemplary embodiment of the invention, the second RFIC 906 is larger and generates more heat than does the first RFIC 904. For this reason the thermal pad 910 onto which the heat slug 912 of the second RFIC 906 is mounted has a larger top surface area than does the thermal pad 914 onto which the heat slug 916 of the first RFIC 904 is mounted. The heatsink post 918 for the second RFIC 906 also preferably has, though not necessarily, a larger diameter D2 than the diameter D1 of the heatsink post 920 for the first RFIC 904.

Figure 10:
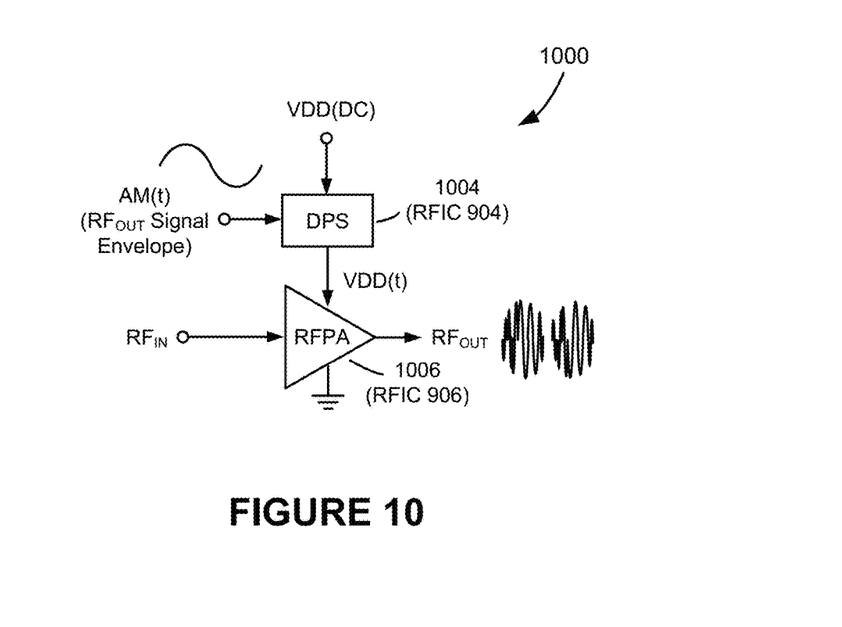
FIG. 10 is a block diagram of a dynamic power supply (DPS) transmitter including first and second radio frequency ICs (RFICs), which, when integrated in the IC-PCB assembly depicted in FIG. 9, exploit the low-resistance, low-inductance, and high performance heat removal properties afforded by the multi-post heatsink plate.

In one particular embodiment of the IC-PCB assembly 900, and as illustrated in FIG. 10, the first RFIC 904 comprises a dynamic power supply (DPS) 1002 that produces an envelope following power supply voltage (i.e., DPS voltage) VDD(t) and the second RFIC 906 comprises an RF power amplifier (RFPA) 1004. Together, the DPS 1002 and RFPA 1004 form an RF "dynamic power supply transmitter" 1000 or "DPS transmitter" 1000. Further details concerning the electrical design and operation of various types of DPS transmitters may be found in the book: "Dynamic Power Supply Transmitters, Envelope Tracking, Direct Polar and Hybrid Combinations," The Cambridge RF and Microwave Series, First Edition, Cambridge University Press (2015), by Earl W. McCune.

RF power measurements taken on one particular RFIC 1004 assembled according to the IC-PCB assembly 900 depicted in FIG. 9 compared to RF power measurements taken from the same RFIC but assembled according to a prior art IC-PCB assembly similar to that depicted in FIG. 1 reveal the effectiveness of the IC-PCB assembly 900 at conducting heat away from the second RFIC 906. The measurements reveal that the particular RFPA 1004 is capable of producing an RF output of up to 40 dBm (10 W) @ 200 MHz and up to 36 dBm (4 W) @ 3 GHz—nearly double the RF output power that the same RFIC 904 is able to produce at and between both frequencies when assembled using a thermal via array like that depicted in FIG. 1. The ability of the RFPA 1004 to produce essentially double the RF output power over the entire 3 GHz frequency range follows from: 1) the IC-PCB assembly's 900's superior ability to conduct heat away from the second RFIC 906 (RFPA 1004); 2) the lower electrical resistance of the heatsink post 918 compared to the electrical resistance of the prior art thermal via array; and 3) the lower electrical inductance of the heatsink post 918 compared to the electrical inductance of the prior art thermal via array.

Figure 11:
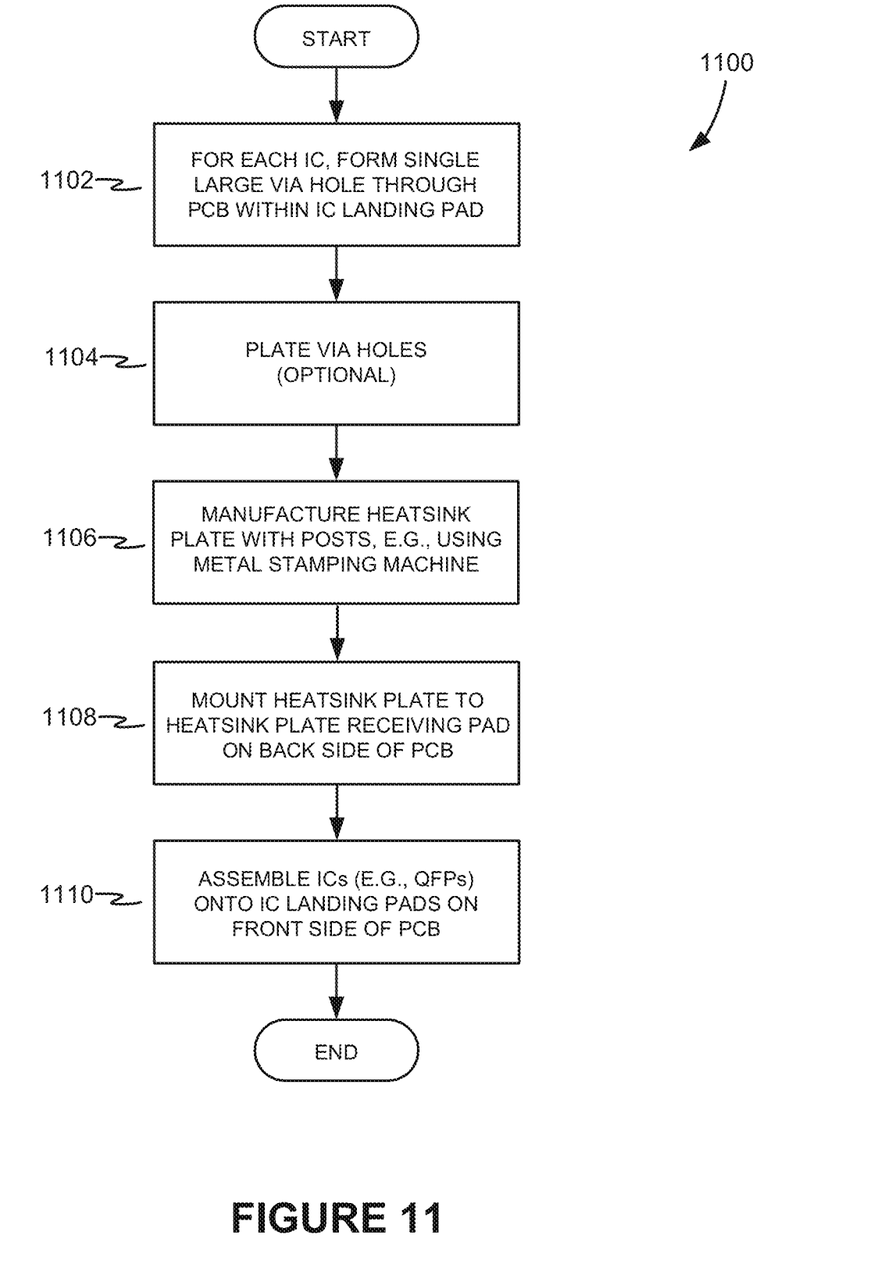
FIG. 11 is a method of manufacturing an IC-PCB assembly similar to that depicted in FIG. 9, according to one embodiment of the present invention.

FIG. 11 is a flowchart illustrating a method 1100 of manufacturing an IC-PCB assembly similar to that depicted in FIG. 9, in accordance with one embodiment of the invention. In this exemplary method 1100, it is assumed that all PCB signal traces and pads have been formed (e.g., patterned and etched) on both sides of the PCB prior to the start of the method 1100. However, it should be mentioned that those preliminary steps could be considered as steps of the manufacturing method 1100 itself. It should also be mentioned that the various steps in the method 1100 are not necessarily performed in the order shown in the flowchart. Some step(s), for example step 1106, can be performed prior to or in parallel with (i.e., at the same time as) some of the earlier steps in the method 1100. In first step 1102, two large via holes are formed (e.g., drilled, if the holes are circular) through the IC landing pads (thermal pads) 914 and 916. Next, at optional step 1104 the surfaces defining the via holes are plated, e.g., with copper or some other thermally conductive (or electrically and thermally conductive) material. At step 1106 the heatsink plate 908 is manufactured, for example, by stamping the posts 918 and 920 in a single solid bulk copper metal plate using a metal stamping machine. If necessary, this step 1106 may further include trimming the stamped posts 918 and 920 to ensure they are of optimal length and shape. At step 1108, the manufactured heatsink plate 908 is mounted to the heatsink plate receiving pad 922 on the back side (bottom) of the PCB 902, for example, by soldering the heatsink plate 908 to the heatsink plate receiving pad 922 or by gluing it to the heatsink plate receiving pad 922 using a thermally conductive (or thermally and electrically conductive) adhesive. As this mounting step 1108 is being performed, the posts 918 and 920 are inserted into the two large via holes that were formed through the PCB 902 and thermal pads 914 and 916 in step 1102. Preferably, after the posts 918 and 920 are inserted into their respective via holes, the top surface of each post 918 and 920 is coplanar with the top major surface of its associated thermal pad 910 or 914 and the posts 918 and 920 fit properly in their respective via holes. If the top surface of either post 918 or 920 is not coplanar with its associated thermal pad 910 or 914 or either post 918 or 920 does not have the desired shape (e.g., desired diameter if the posts 918 and 920 are cylindrically shaped), the trimming operation in step 1106 can be repeated and/or steps 1102 and 1104 can be performed again before the heatsink plate 908 is permanently attached (by soldering and/or gluing) to the heatsink plate receiving pad 922. Finally, once the heatsink plate 908 has been permanently affixed to the heatsink plate receiving pad 922, at step 1100 the first and second ICs 904 and 906 are mounted on the front side (top) of the PCB by soldering and/or gluing the heat slugs 916 and 912 of the first and second ICs 904 and 906 to their respective thermal pads 914 and 910 using a thermally conductive (or thermally and electrically conductive) adhesive. Alternatively, the first and second ICs 904 and 906 and their respective heat slugs 916 and 912 may be mounted to the PCB before the heatsink plate 908 is mounted to the heatsink plate receiving pad 922.

While various embodiments of the present invention have been described, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments but, instead, should be determined by the appended claims, including the full scope of equivalents to which such claims are entitled.

The invention claimed is:

1. A method of manufacturing an integrated circuit/printed circuit board (IC-PCB) assembly, comprising:
    forming a first hole through a PCB with the first hole within a first IC landing pad patterned in a first conductive layer on a first side of the PCB;
    shaping or working a thermally conductive metal plate to form a first post that projects from a major surface of the thermally conductive metal plate; and
    mounting the thermally conductive metal plate to a heatsink pad patterned in a second conductive layer on a second, opposing side of the PCB, said mounting including inserting the first post through the first hole from the second side of the PCB and soldering or gluing the major surface of the thermally conductive metal plate to the heatsink pad.

2. The method of claim 1, wherein shaping or working the thermally conductive metal plate includes working or shaping the post so that it has a length that results in a top surface of the first post being generally coplanar with a top surface of the first IC landing pad after the thermally conductive metal plate is mounted to the heatsink pad on the second side of the PCB.

3. The method of claim 1, further comprising mounting a first IC heat slug of a first IC to the first IC landing pad.

4. The method of claim 1, wherein shaping or working the thermally conductive metal plate to form the first post comprises stamping the first post using a metal stamping machine.

5. The method of claim 1, further comprising plating the first hole with metal to electrically connect the first IC landing pad patterned in the first conductive layer on the first side of the PCB to the heatsink pad patterned in the second conductive layer on the second side of the PCB.

6. The method of claim 1, further comprising:
    forming a second hole through the PCB with the second hole within a second IC landing pad patterned in the first conductive layer on the first side of the PCB; and shaping or working the thermally conductive metal plate to form a second post that projects from the major surface of the thermally conductive metal plate, wherein mounting the thermally conductive metal plate to the heatsink pad on the second side of the PCB further includes inserting the second post through the second hole, from the second side of the PCB.

7. The method of claim 6, wherein shaping or working the thermally conductive metal plate to form the first and second posts comprises stamping the first and second posts using a metal stamping machine.

8. The method of claim 6, further comprising:

plating the first hole with metal to electrically connect the first IC landing pad patterned in the first conductive layer on the first side of the PCB to the heatsink pad patterned in the second conductive layer on the second side of the PCB; and plating the second hole with metal to electrically connect the second IC landing pad patterned in the first conductive layer on the first side of the PCB to the heatsink pad patterned in the second conductive layer on the second side of the PCB.

9. The method of claim 6, further comprising mounting a second IC heat slug of a second IC to the second IC landing pad.

10. The method of claim 9, wherein the second IC landing pad has a larger surface area than a surface area of the first IC landing pad, the second hole is larger than the first hole, and the second post is larger than the first post.

\* \* \* \* \*